United States Patent [19]

Oechsner

[11] Patent Number: 5,017,835
[45] Date of Patent: May 21, 1991

[54] HIGH-FREQUENCY ION SOURCE

[76] Inventor: Hans Oechsner, Vogelweher Strasse 7 B, D-6750 Kaiserslautern, Fed. Rep. of Germany

[21] Appl. No.: 415,259
[22] PCT Filed: Mar. 16, 1988
[86] PCT No.: PCT/DE88/00152
  § 371 Date: Nov. 20, 1989
  § 102(e) Date: Nov. 20, 1989
[87] PCT Pub. No.: WO88/07259
  PCT Pub. Date: Sep. 22, 1988

[30] Foreign Application Priority Data

Mar. 18, 1987 [DE] Fed. Rep. of Germany ....... 3708716

[51] Int. Cl.[5] .................... H01J 27/18; H05H 1/46
[52] U.S. Cl. .................... 315/111.81; 315/111.21; 315/111.31; 315/111.41; 315/111.51; 313/231.31; 250/423 R
[58] Field of Search .................... 315/111.21, 111.31, 315/111.41, 111.51, 111.81, 248; 313/231.31; 333/32; 250/423 R

[56] References Cited

U.S. PATENT DOCUMENTS

| | | | |
|---|---|---|---|
| 3,634,704 | 1/1972 | Stix | 310/11 |
| 4,417,178 | 11/1983 | Geller et al. | 315/111.81 |
| 4,447,773 | 5/1984 | Aston | 315/111.31 X |
| 4,727,298 | 2/1988 | Mendel | 313/231.31 X |
| 4,774,437 | 9/1988 | Helmer et al. | 315/111.81 |
| 4,849,675 | 7/1989 | Müller | 315/111.51 |
| 4,857,809 | 8/1989 | Torii et al. | 315/111.41 X |
| 4,859,908 | 8/1989 | Toshida et al. | 315/111.21 X |
| 4,870,284 | 9/1989 | Hashimoto et al. | 315/111.81 X |
| 4,904,872 | 2/1990 | Grix et al. | 250/423 R |

FOREIGN PATENT DOCUMENTS

| | | |
|---|---|---|
| 2359996 | 2/1978 | France . |
| 61-34832 | 2/1986 | Japan . |
| 1399603 | 7/1975 | United Kingdom . |

OTHER PUBLICATIONS

C. P. Swann and J. F. Swingle, Jr., "A Radiofrequency Ion Source", The Review of Scientific Instruments, vol. 23, No. 1, pp. 636–638 (Nov. 1952).
I. Ogawa and N. Abe, "Electron Cyclotron Resonances in a Radiofrequency Ion Source", Nuclear Instruments and Methods, vol. 16, pp. 227–232 (1962).
O. Sager, "Der Einfluss von Dichterporfil und Elektronentemperatur Auf Die Helikonresonanzzustaende in Niederdruckentladungen", Z. Angew. Physik, vol. 31, Nos. 5–6, pp. 282–286 (1971).
J. A. Kernahan and E. H. Pinnington, "Production of Metallic Ions in a 2mv Van de Graaf", Nuclear Instruments and Methods, vol. 166, pp. 313–314 (1979).
S. Pesic, "On the Generator of Dense Plasma in ECR Ion Sources", Nuclear Instruments and Methods, vol. 198, pp. 593–594 (1982).
"Plasmetechnik: Grundlagen und Anwedungen, Eine Einfuhrung", Publisher: Carl Hanser, Munich, Vienna, pp. 396–404 (1984).
J. Freisinger and H. W. Lob, "The Neutral Particles Injectors Rig for Fusion Reactors", Atomkernenergie-Kerntechnik, vol. 44, No. 1, pp. 81–86 (1984).
M. Iwaki and K. Yoshida, "Riken 200 kv High Current Implanter for Metal Surface Modication", Nuclear Method and Instruments in Physics, vol. B6, pp. 51–55 (1985).

Primary Examiner—Eugene R. LaRoche
Assistant Examiner—Do Hyun Yoo
Attorney, Agent, or Firm—Peter K. Kontler

[57] ABSTRACT

A high-frequency ion source for the production of an ion beam using electron cyclotron resonance has a tubular vessel whose shape matches the desired shape of the beam. The vessel, which is designed to accommodate an ionizable gas, is surrounded by a coil, and the coil is coupled to a high-frequency generator via a resonant circuit. A Helmholtz coil pair matched to the shape of the vessel is arranged to generate a magnetic field which is directed normal to the axis of the coil surrounding the vessel. The vessel is clamped between two plates and one of the plates contains a system for extracting ions from the vessel. The extraction system includes a plurality of spaced electrodes which function to attract and accelerate ions. The electrodes are formed with slotted openings which shape a stream of ions flowing out of the vessel into the form of a flat beam. An additional electrode can be provided to suppress the escape of electrons from the beam back into the vessel.

6 Claims, 3 Drawing Sheets

HIGH-FREQUENCY ION SOURCE

BACKGROUND OF THE INVENTION

The invention relates to a high-frequency ion source for the generation of large-area ion beams. The ion source has a vessel for the substances, particularly gases, which are to be ionized. High-frequency energy can be inductively coupled into the plasma and a weak, d.c. magnetic field is provided.

Large-area ion sources are required for a variety of applications. For instance, they represent an indispensable tool for modern surface and thin film technology. Typical uses, among others, are the large-area removal of homogeneous solid surfaces or solid surfaces covered with structure-producing masks (ion beam etching), or ion beam atomization of one or more solid targets for the production of thin surface layers or thin film systems.

As a rule, the large-area ion sources employed for this consist of a bundle of many individual ion beams which are extracted from a low-pressure plasma by means of one or more sieve-like electrodes arranged one behind the other at a negative potential relative to the plasma. The necessary low-pressure plasma is produced in the respective working gas by electron impact ionization in a known manner. The required electrons are mostly supplied by electron sources of various structure having an electron-accelerating section downstream.

Such ion sources, however, have significant drawbacks during continuous operation or with certain working gases. Thus, for example, thermionic electron emitters ("glow cathodes") have only a limited life. They are very rapidly contaminated or completely destroyed when reactive working gases are used. Due to the limited lateral extent of electron emitters or other electron sources, plasmas of large cross section can be realized only by the use of electron sources which are disposed next to one another. This leads to a non-uniform distribution of the plasma density, and consequently of the ion current density distribution, in the extracted ion beam bundle. Furthermore, as a result of the required current and voltage supplies for the electron sources necessary for plasma production, it is technically complicated to operate such sources at high electrical potential, i.e., to accelerate the ion beam from a high potential onto a grounded workpiece.

The British Patent Specification No. 1 399 603 discloses ion sources in which a d.c. magnetic field continuously acts in axial direction with respect to the vessel axis and, principally by precision utilization of the field inhomogeneity, functions to focus the source plasma in a direction towards the extraction region. A strong magnetic field is used and the vessel always has the same cylindrical form.

Details of an ion source are presented in "Patent Abstracts of Japan", Vol. 10, No. 186 (E-416) (2242), 28 June 1986 and the Japanese Publication No. 61-34832. Thus, by way of example, an ion extraction system with a plurality of extraction electrodes is disclosed in which one electrode can have a suppression voltage.

Details of an ion source are also contained in the French Publication No. 2 359 996 which, among other things, is concerned with an extraction electrode of non-conductive material.

SUMMARY OF THE INVENTION

It is an object of the invention to provide a high-frequency ion source of the type more precisely defined at the outset with which large-area ion beams having high current strength and arbitrary cross-sectional geometry, e.g., a band shape, can be generated from ions of all types.

In accordance with the invention, this object is achieved in that a plasma excitation at gas pressures in the high-vacuum range can be carried out in a tubular plasma vessel by electron cyclotron waves which are resonant with respect to the dimensions of the plasma vessel. The plasma vessel is matched to the shape of the desired ion beam and is clamped between a carrier plate and a closure plate. An intermediate circuit capable of being resonated is arranged between the high-frequency generator and the load circuit coil. The weak, d.c. magnetic field, which must be directed perpendicular to the axis of the load circuit coil based on the theory of electron cyclotron wave resonance and has a magnitude given by theory, is generated by a Helmholtz coil pair whose geometric configuration is matched to the shape of the plasma vessel. An ion-optical system for ion extraction, consisting of a plurality of electrodes and matched to the geometry of the desired ion beam, is arranged in the carrier plate.

According to another embodiment of the invention, a first and a second extraction electrode are provided as the system for ion extraction. A voltage serving as a potential step for the separation of subsequently ionized, injected foreign particles from the plasma ions is applied to the electrodes. Additional electrodes with applied ion-accelerating voltages, and a suppression electrode, are provided.

A further embodiment of the invention consists in that the first extraction electrode is composed of non-conductive material and the voltages of the additional electrodes are applied to the second extraction electrode.

In accordance with the invention, the plasma vessel can be constructed as a parallelepiped with rounded sides and open end faces and the system for ion extraction can have slit-shaped electrodes.

It is also within the scope of the invention for an atomization target to be arranged on the closure plate.

On the other hand, it can be advantageous according to the invention for the closure plate to be connected, via openings, with a vacuum vessel which accommodates resistance or electron beam vaporizers.

The advantages achieved with the invention reside particularly in that the plasma generation occurs completely without electrodes, solely by means of external elements, in a plasma vessel with a simple, arbitrary geometrical shape. Aging or contamination phenomena as may arise in ion sources with an additional electron source are accordingly eliminated. The new high-frequency ion source utilizing electron cyclotron wave resonance thus has a very long operating life in comparison to other ion sources. The geometrically simple form of the discharge chamber is of significant advantage as regards vacuum technology. It is to be emphasized that the high-frequency ion source has a high degree of purity since the geometrically simple discharge vessel is constantly "baked out" due to heating by the high-frequency dielectric losses in the vessel wall. As a rule, the temperatures generated do not exceed 100° C.

It is further of advantage that only low high-frequency voltages arise at the plasma vessel. Consequently, disrupting high-frequency charges, which can lead to atomization of walls and structural components, are largely eliminated.

Also important for practical applications of such sources is the operating pressure which is low as compared to other types of sources. This makes it possible to use flat ion-optical systems with large openings for ion extraction and to simultaneously maintain the required low gas pressure in the bombarding chamber or the downstream ion-accelerating section.

An additional significant advantage resides in that plasma generation occurs with purely inductive coupling. It thus becomes possible, as regards d.c. voltage, to electrically insulate the load circuit with the plasma vessel from the high-frequency generator and possible coupling circuits. The high-frequency plasma, as an ion-generating element, can then be placed at a practically arbitrarily high electrical potential relative to the high-frequency generator which is operated near ground. The electrical insulation can be provided in a single stage between the last coupling coil and the load circuit coil or in a plurality of stages between the decoupling coil of the high-frequency generator and the first coupling coil of an intermediate circuit, and thereafter between the second coil of the intermediate circuit and the load circuit coil. Finally, the generated low-pressure plasma is itself still electrically insulated from the load circuit coil by the plasma vessel wall which consists of an insulating material. The coils (preferably in Helmholtz geometry) necessary for production of the requisite steady magnetic field can be arranged at a sufficiently great distance from the electrically high part of the arrangement (load circuit coil and plasma) and can therefore likewise be operated near ground potential.

BRIEF DESCRIPTION OF THE DRAWINGS

An exemplary embodiment is illustrated in the drawings and described in more detail below.

There is shown

DESCRIPTION OF THE PREFERRED EMBODIMENTS

Figure 1:
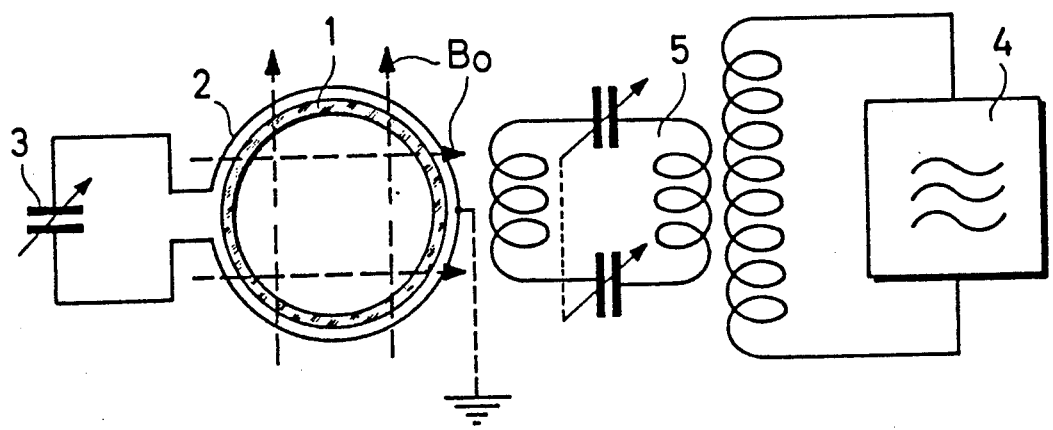
FIGS. 1 and 2 basic circuit diagrams of the high-frequency ion source.
Figure 2:
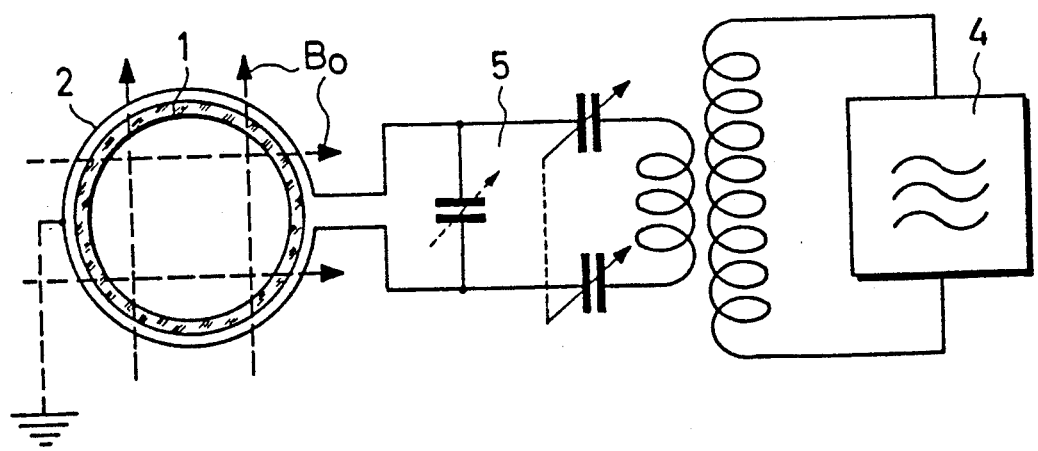

The high-frequency ion source employs the method of electron cyclotron wave resonance for plasma generation. To this end, as illustrated in FIG. 1, high-frequency energy is coupled into the plasma by a coil 2, preferably a single-wound coil, which is placed around a plasma vessel 1 and, together with a capacitor 3 capable of being resonated, forms an electrical resonant circuit. This so-called load circuit coil 2 is now coupled to a high-frequency generator 4 either inductively or by a direct electrical connection (FIG. 2). A further intermediate circuit 5 capable of being resonated can be connected between the high-frequency generator 4 and the load circuit coil 2.

At sufficiently high gas pressure (typically $10^{-2} - 10^{-1}$ mbar) in the plasma vessel 1, an electrical gas discharge plasma arises due to the action of the high-frequency rotating electrical field. For plasma excitation by electron cyclotron wave resonance, it is now important for a weak, d.c. magnetic field $B_0$, which is perpendicular to the axis of the load circuit coil 2 and is as uniform as possible, to be superimposed on the arrangement. Such a d.c. magnetic field is advantageously produced by a Helmholtz coil pair 6 (FIGS. 3, 4) whose geometric configuration can be matched to the shape of the plasma vessel 1. The excited low-pressure plasma becomes anisotropic, as regards its electrical properties, under the action of $B_0$ with the axis of anisotropy being determined by the direction of $B_0$. If electromagnetic waves from the load circuit coil 2 then enter the now electrically anisotropic conductive medium "plasma", the dispersion relationships calculated for this situation indicate that wave spreading takes place in known manner above the plasma frequency $\omega_{p1}$ which is modified by the presence of the steady magnetic field $B_0$. However, if the dispersion relationships for the right circular and left circular portions of an incoming plane wave are considered separately, then it is found that wave spreading for the right circular wave portion is also possible in a frequency range below the electron cyclotron frequency $\omega_{c,e}$ when the wave vector k of the plane wave under consideration lies along the anisotropy axis of the conductive medium, i.e., along the direction of $B_0$. Taking into account the boundary conditions established by the surrounding load circuit coil 2, resonant plasma excitation via these so-called electron cyclotron waves with a frequency $\omega < \omega_{c,e}$ occurs when the length d of the plasma in the direction of propagation of the right circular electron cyclotron wave is respectively an odd-numbered multiple of half the wavelength of these waves, i.e., when $$\lambda_{res} = 2d/(2z+1)$$

applies. Here, z represents the order of the resonance.

The electron cyclotron frequency $\omega_{c,e}$ constitutes an accumulation point for the respective resonant frequencies $\omega_z$ (z=0, 1, 2 . . .) where $\omega_z < \omega_{c,e}$. This means that, at an excitation frequency $\omega$ set by the high-frequency generator, electron cyclotron wave resonance of a specific order z can be established by appropriate selection of the magnitude of the superimposed d.c. magnetic field $B_0$ which, in turn, determines $\omega_{c,e}$. In practice, excitation at the fundamental resonance $\omega_0$ or the first upper resonance $\omega_1$ are of significance.

By way of explanation, it is noted that the relative dielectric constant DK of the plasma becomes very large in the region of propagation of the electron cyclotron waves. Hence, the wavelength of the electron cyclotron waves, which is derived from the vacuum wavelength by division with the square root of DK, becomes so small that it becomes comparable with the dimensions of the plasma vessel 1. The associated DK values are a function of the electron density, i.e., the density of the generated low-pressure plasma, and the vessel geometry.

The effectiveness of plasma excitation by electron cyclotron wave resonance increases as the gas pressure decreases since the influence of resonance damping due to impacts of the plasma particles with one another then decreases. The lowest operating pressure for resonant excitation by electron cyclotron waves is achieved when, as the gas density continues to decrease, there are no longer sufficient neutral gas atoms available in the plasma volume to ionize so as to compensate for particle losses at the vessel walls. Depending upon vessel size, this lower boundary pressure is $10^{-4}$ mbar for argon as a working gas while for xenon, by way of example, it is below $10^{-6}$ mbar With sufficiently good matching of the load determined by the plasma to the high-frequency generator 4 and high-frequency technical optimization of the arrangement, plasma ionization rates of about $10^{-2}$ can be achieved at L- operating pressures in the $10^{-4}$ mbar range.

Figure 4:
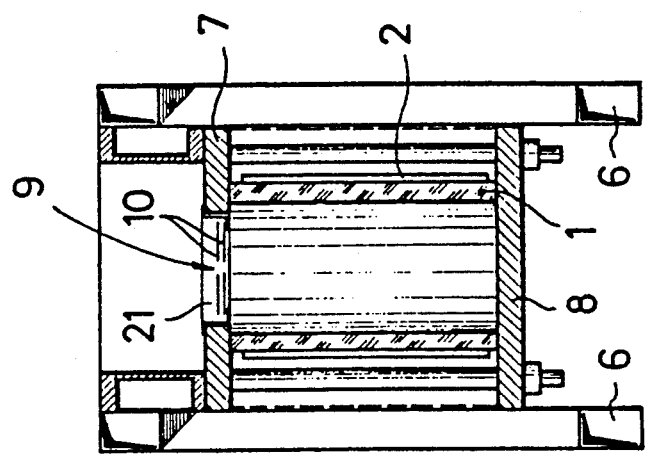
FIGS. 3 and 4 two views of details of the plasma vessel.
Figure 3:
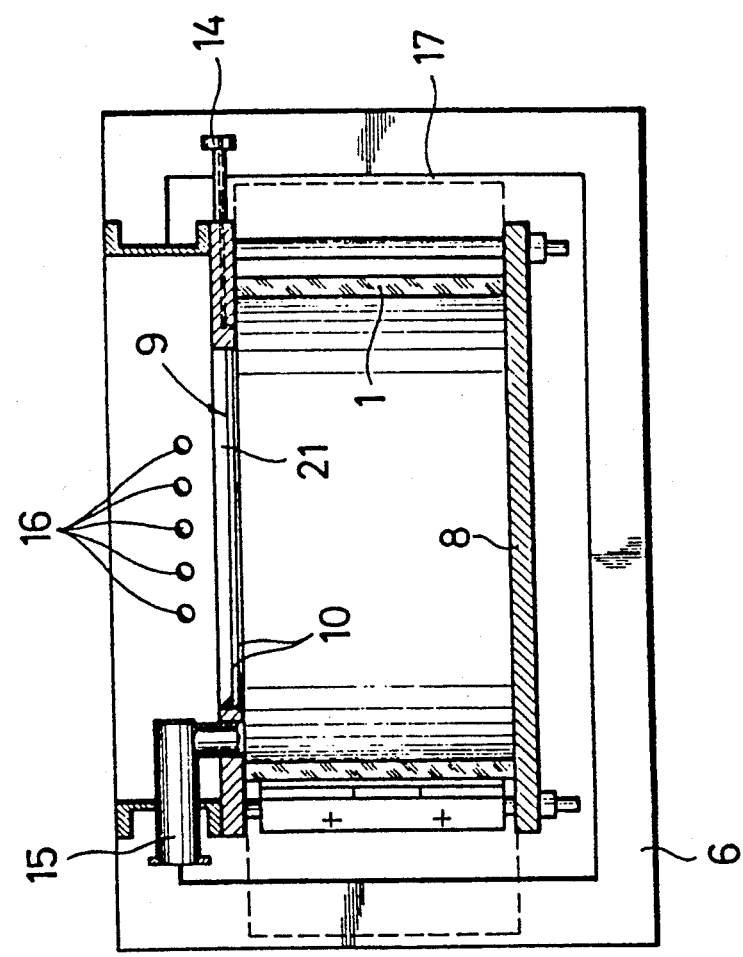

A practical design of a high-frequency ion source with electron cyclotron wave resonance for plasma excitation is shown in FIGS. 3 and 4. A band-shaped ion beam is to be produced with this ion source. The ion beam can subsequently be periodically deflected perpendicular to its longitudinal side using, for example, an electrical deflecting device which consists of two condenser plates. Alternatively, the ion beam is further accelerated in an ion-implantation arrangement by downstream slit-like electrodes and then impinges on a workpiece to be implanted (not illustrated) as a band-shaped, highly energetic ion beam.

The shape of the plasma vessel 1 is advantageously matched to the shape of the desired band-shaped ion beam. It consists of a parallelepipedal, tube-like glass vessel with rounded sides and open end faces (FIGS. 3, 4). The plasma vessel 1 is clamped between a carrier plate 7 and a closure plate 8. The extraction system 9 for production of the ion beam is disposed in one of the end faces. The geometric shape of the extraction system 9 can also be matched in the necessary manner to the respective required cross-sectional shape of the ion beam or an entire ion beam bundle. In the exemplary embodiment illustrated in FIGS. 3 and 4, the ion extraction system 9 consists of two flat electrodes 10 with slit-like openings which lie behind, and are adjusted relative to, one another. The electrode having the greater slit width is arranged on the plasma side and that having the smaller slit width is arranged on the side of the bombardment chamber.

In FIGS. 3 and 4, the gas inlet is denoted by 14 and 15 is a nipple for the connection of measuring devices to determine plasma pressure. Electrical passages for the connections to the extraction electrodes 10 are indicated at 16. A shield is denoted by 17.

The electrode 10 at the plasma side lies at a relatively low potential relative to the plasma (approximately 50 volts negative relative to the plasma); ion acceleration occurs primarily in the electrical field between the first and second extraction electrodes 10 which are at a spacing of a few millimeters from one another. Depending upon the electrical insulation between the two extraction or ion lens electrodes 10 which are mounted one behind the other, the extracted plasma ions can be accelerated to energies of up to several keV.

Figure 5:
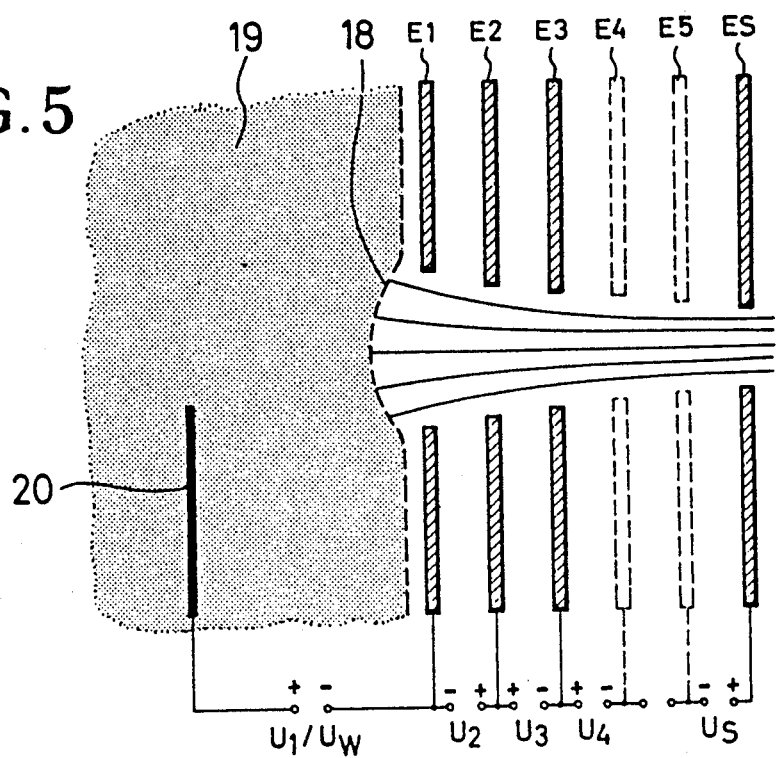
FIG. 5 schematically a system for ion extraction.

The ion-emitting plasma boundary surface 18 above the opening of the extraction system 9, together with the electrodes of the latter, define an ion optical "immersion system" which, for example, makes beam focusing possible (FIG. 5). By virtue of the shape of the ion-emitting plasma boundary surface 18 which is curved towards the plasma 19, plasma ions are extracted from a larger area than corresponds to the geometric opening in the extraction electrode El on the plasma side. The focusing conditions for the extracted ion beam, and accordingly its geometric cross-sectional shape, are regulated by the electrical potentials at the extraction electrodes $E_1$, $E_2$ as well as by the geometric arrangement (width of the extraction openings, spacing of the extraction electrodes, etc.). One or more electrodes $E_3 \ldots E_n$ having a shutter-like construction, for example, can follow the extraction electrode $E_2$ on the bombardment chamber side to further accelerate the ion beam. The voltage $U_2$ represents a potential step for the separation of subsequently ionized, injected foreign particles from the plasma ions. $U_3$ and $U_4$ are additional ion-accelerating voltages at the extraction electrodes $E_3$ and $E_4$. Us is a voltage at the suppression electrode $E_s$ to suppress the escape of electrons from the ion beam back into the plasma 19.

As outlined in FIG. 5, the electrical potentials at the extraction electrodes $E_1 \ldots E_n$ and the suppression electrode $E_2$ can be applied to a further reference electrode 20 which is in contact with the plasma 19. This reference electrode 20 can be a metallic closure surface at the end face of the plasma 19 which is opposite the extraction system 9. However, the reference electrode 20 to which the extraction voltages are applied can also be an additional pin-shaped electrode which projects into the plasma and, by appropriate selection of the geometric surface thereof exposed to the plasma 19, can just as well be brought to the potential of the surrounding plasma 19 itself.

In a prototype of such a high-frequency ion source, a band-shaped ion beam was extracted from low-pressure plasma of argon and nitrogen by means of an ion extraction system 9 consisting of two slit-shaped electrodes. The ion beam had an overall width of 20 cm, as well as a thickness of 2 mm upon exiting the extraction electrode at the side of the bombardment chamber. With an ion extraction energy of 3 keV, the total extracted ion current in the band-shaped ion beam was between 25 and 30 mA. At a working gas pressure of a few $10^{-4}$ mbar, the power loss in the plasma was about 150 watts. Plasma excitation occurred at a frequency of 27.12 MHz.

Another possibility for ion extraction is to operate the first electrode $E_1$ at the plasma side of the extraction system 9 as a so-called insulated electrode relative to which the plasma 19 automatically establishes itself at a positive potential in order to maintain its quasi neutrality.

The downstream voltages between the second or additional extraction electrodes ($E_2 \ldots E_n$) are then applied to the second extraction electrode on the plasma side.

Such an insulated electrode $E_1$ can also be made of non-conductive material, possibly in the form of a slotted quartz plate. An overall voltage drop $U_w$ given by $$U_w = \frac{k \cdot T_e}{2 e_0} l_n \left( \frac{M_i}{\alpha^2 \cdot 2\pi \cdot m_e} \right)$$

is established between the plasma 19 and an insulated electrode $E_1$, and also relative to the vessel wall ($T_e$ is the temperature of the plasma electrons, $m_e$ the electron mass, $M_i$ the ion mass, k the Boltzmann constant, $\alpha$ an empirical factor having a value of approximately 0.8, $e_0$ the elemental charge and $1_n$ the abbreviation for natural logarithm while $\pi = 3.14 \ldots$). The mentioned electrode $E_1$, which consists of insulating material and is slit-shaped, for instance, lies at a negative potential relative to the plasma 19 by virtue of the potential drop $U_w$. Due to this potential drop $U_w$, positive plasma ions are accelerated towards such electrode and exit through the slit machined therein or through a differently shaped opening. The issuing plasma ions can subsequently be further accelerated by an ion-optical system ($E_2 \ldots E_n$) and geometrically concentrated into an ion beam whose geometric shape is determined by the opening in the mentioned structural component and the shape of the openings in the ion-accelerating optical system. The requisite quasi neutrality of the plasma is assured in that as many electrons as ions pass through the opening in the insulated electrode $E_1$. In this manner, possible disruptive charges on the accelerating electrodes $E_2 \ldots E_n$, as well as on $E_s$, also can be avoided.

Since the electrodeless method of plasma excitation by electron cyclotron wave resonance requires no electrodes in the plasma chamber, the entire remainder of the plasma vessel, including the closure plate 8 located opposite the ion exit surface 21, can likewise be made of an insulating material such as, for example, quartz. Hence, the entire wall of the ion-generating plasma vessel 1 can be composed of a material which is resistant to chemically aggressive gases. The high-frequency ion source can therefore also be used to generate an arbitrarily shaped, large-area ion beam or ion beam bundle from ions of aggressive or reactive gases. With an appropriate geometric design and appropriately applied potential, the ion-accelerating system behind the ion exit surface 21 is not contacted by the extracted ion beam and accordingly is also not affected by the extracted reactive or chemically aggressive ions.

Numerous experiments regarding the magnitude of the electron temperature $T_e$ in a low-pressure plasma excited by electron cyclotron wave resonance have shown that $T_e$ is of the order of 100,000 Kelvins and that, to a very good approximation, the plasma electrons exhibit a Maxwell velocity distribution. Due to the high value of $T_e$, the electron component of such a low-pressure plasma can also function to ionize foreign particles which are brought into the plasma.

Figure 6:
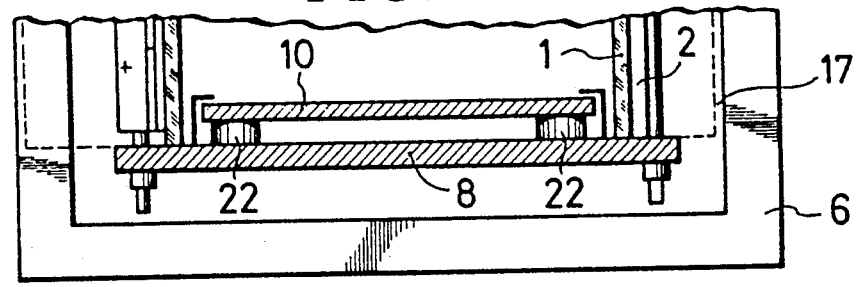
FIG. 6 the cover plate with an atomization target.

For instance, metallic particles (atoms or molecules) can be introduced into the plasma vessel 1 of the ion source in the manner that a sputtering target 10 composed of any metal is arranged on the closure plate 8 located in the plasma vessel 1 opposite the ion exit surface 21 (FIG. 6). If a negative potential relative to the plasma 19 is imparted to this sputtering target 10 which rests on insulating supports 22, then it is bombarded by plasma ions so that metallic atoms are released from the target surface and enter the plasma volume. There they are ionized with a probability of the order of 1% by impact with plasma electrons. They can then be extracted in the form of an ion beam by means of the ion optical arrangement in a manner analogous to the plasma ions themselves. In this connection, it is particularly important that the metallic atoms or molecules released (atomized) by ion bombardment have a kinetic energy substantially greater than that of the plasma ions themselves. As a rule, the average energy of the atomized metallic particles is 15–20 electron volts while the plasma ions leave the plasma with an energy of only a few (4–5) electron volts. By utilizing a suitable electrical potential step ($U_2$) during ion extraction, this makes it possible to separate the subsequently ionized metallic particles from the ions of the working gas and, in this manner, produce a pure beam of metallic ions.

Figure 7:
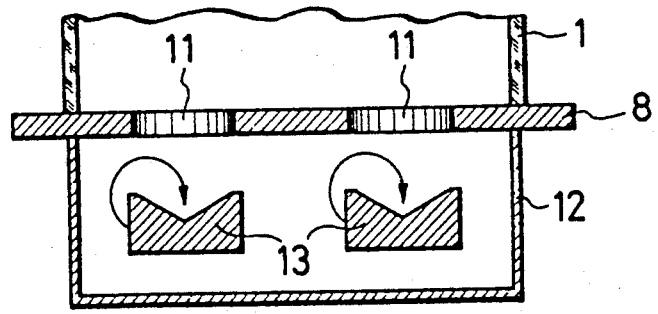
FIG. 7 the cover plate provided with openings, and a vacuum vessel with electron beam vaporizers connected thereto by flange means.

Another possibility for introducing metallic atoms into the plasma 19 is to situate a vacuum vessel 12 behind the closure plate located in the plasma vessel 1 opposite the extraction system 9. A stream of metallic vapor is generated in the vacuum vessel 12 by resistance vaporization or via electron beam vaporizers 13 and enters the plasma 19 through suitable openings 11 in the closure plate 8. Such an arrangement is sketched in FIG. 7. The entering metallic atoms and molecules are likewise ionized by the plasma electrons and can then be extracted as an ion beam in the manner described together with the ions of the working gas. In as much as the kinetic energies of the different types of particles do not differ here, additional measures allowing the metallic ions to be separated from the plasma ions must be taken. Such arrangements consist, for example, of suitably configured d.c. magnetic fields or combinations of d.c. magnetic fields and d.c. electrical fields. Since, as a rule, such separation procedures make use of the differences in mass between the various particle components of a mixed particle beam, helium is here preferred as a working gas for plasma generation. On the one hand, a helium plasma has a particularly high electron temperature $T_e$ thereby assuring a particularly high ionization probability for the entering metallic atoms. On the other hand, helium ions have a small mass compared to all metallic atoms which exerts a particularly favorable effect on the separation of the working gas ions and the metallic ions.

The type of particles entering the plasma excited by electron cyclotron wave resonance is not limited to metallic atoms or molecules since nonconducting materials can also be converted into vapor form by means of suitable arrangements. The so-called method of high-frequency atomization in which a target of insulating material is given a high-frequency potential relative to a plasma is especially well-suited for this purpose. This method of high-frequency atomization can be combined with the developed high-frequency ion source in a simple fashion. To this end, the sputtering target 10 seated on the closure plate 8 (FIG. 6) is replaced by a suitable insulating target which is then supplied with a high-frequency potential relative to the potential of the plasma 19 in a known manner. The high-frequency voltage required for this purpose is advantageously additionally drawn from the highfrequency generator 4 which is used for plasma generation with the help of electron cyclotron wave resonance.

As explained, the high-frequency ion source described allows large-area ion beams of arbitrary cross-sectional geometry, e.g., in the form of a band, to be produced from any type of ion.

I claim:

1. High-frequency ion source for the generation of large-area ion beams, the ion source having a vessel for substances, particularly gases, to be ionized, high-frequency energy being capable of being inductively coupled into a plasma and a d.c. magnetic field being superimposed on the plasma, characterized in that a plasma excitation at gas pressures in a high-vacuum can be carried out in a tubular plasma vessel (1) by electron cyclotron waves which are resonant with respect to the dimensions of the plasma vessel, the plasma vessel (1) being matched to the shape of the desired ion beam and being clamped between a carrier plate (7) and a closure plate (8), and an intermediate circuit (5) capable of being resonated being arranged between a high-frequency generator (4) and a load circuit coil (2), a weak, d.c. magnetic field, which is directed perpendicular to the axis of the load circuit coil (2) based on the theory of electron cyclotron wave resonance and has a magnitude given by the theory, being generated by a Helmholtz coil pair (6) whose geometric configuration is matched to the shape of the plasma vessel (1), and an ion-optical system for ion extraction (9), consisting of a plurality of electrodes and matched to the geometry of the desired ion beam, being arranged in the carrier plate (7).

2. High-frequency ion source according to claim 1, characterized in that a first and a second extraction electrode ($E_1$, $E_2$) are provided as the system for ion extraction (9), a voltage ($U_2$) serving as a potential step for the separation of subsequently ionized, injected foreign particles from the plasma ions being capable of being applied to the extraction electrodes ($E_1$, $E_2$), and additional electrodes ($E_3$, $E_4$, ... $E_n$) with applied ion-accelerating voltages ($U_3$, $U_4$, ... $U_n$), and a suppression electrode ($E_s$) with a suppression voltage ($U_s$), being provided.

3. High-frequency ion source according to claim 2, characterized in that the first extraction electrode ($E_1$) is made of non-conductive material and the voltages ($U_3$ ... $U_n$) of the additional electrodes are applied to the second extraction electrode ($E_2$).

4. High-frequency ion source according to claim 1, characterized in that the plasma vessel (1) is parallelepipedal with rounded sides and open end faces and the system for ion extraction (9) has slit-shaped electrodes ($E_1$ ... $E_n$, $E_s$).

5. High-frequency ion source according to claim 1, characterized in that an atomization target (10) is arranged on the closure plate (8).

6. High-frequency ion source according to claim 1, characterized in that the closure plate (8) is connected, via openings (11), with a vacuum vessel (12) containing resistance or electron beam vaporizers (13).

* * * * *